(12) United States Patent
Furutani

(10) Patent No.: US 9,136,844 B2
(45) Date of Patent: Sep. 15, 2015

(54) SEMICONDUCTOR DEVICE HAVING LEVEL SHIFTER

(71) Applicant: PS4 LUXCO S.A.R.L., Luxembourg (LU)

(72) Inventor: Kiyohiro Furutani, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 84 days.

(21) Appl. No.: 13/800,540

(22) Filed: Mar. 13, 2013

(65) Prior Publication Data

US 2013/0250704 A1    Sep. 26, 2013

(30) Foreign Application Priority Data

Mar. 20, 2012  (JP) .................................. 2012-064748

(51) Int. Cl.
- *G11C 7/12* (2006.01)
- *H03K 19/0175* (2006.01)
- *H03K 19/00* (2006.01)
- *G11C 7/10* (2006.01)

(52) U.S. Cl.
CPC ...... *H03K 19/017509* (2013.01); *G11C 7/1057* (2013.01); *G11C 7/1069* (2013.01); *G11C 7/12* (2013.01); *H03K 19/0013* (2013.01); *H03K 19/0016* (2013.01)

(58) Field of Classification Search
CPC ............. G11C 7/12; G11C 8/08; G11C 5/145
USPC ....................................................... 365/189.11
See application file for complete search history.

(56) References Cited

U.S. PATENT DOCUMENTS

| | | | |
|---|---|---|---|
| 6,850,090 B2 | 2/2005 | Aoki | |
| 6,934,210 B2* | 8/2005 | Akiba et al. | 365/222 |
| 7,492,654 B2* | 2/2009 | Won et al. | 365/205 |
| 2004/0085092 A1 | 5/2004 | Aoki | |
| 2007/0018710 A1* | 1/2007 | Choi et al. | 327/333 |
| 2007/0188194 A1* | 8/2007 | Yang et al. | 326/80 |
| 2008/0204125 A1* | 8/2008 | Lee et al. | 327/544 |
| 2012/0033506 A1 | 2/2012 | Furutani et al. | |

FOREIGN PATENT DOCUMENTS

| | | |
|---|---|---|
| JP | 2004-153689 A | 5/2004 |
| JP | 2012-038389 A | 2/2012 |

* cited by examiner

*Primary Examiner* — Hoai V Ho
*Assistant Examiner* — Tri Hoang

(57) ABSTRACT

Disclosed herein is a semiconductor device that includes: an internal voltage generator configured to produce an internal voltage in a first mode and stop producing the internal voltage in a second mode; a level shifter configured to receive the internal voltage, a first voltage and a first signal, in order to convert the first signal from a voltage level of internal voltage to a voltage level of the first voltage and output the first signal with the voltage level of the first voltage; and a logic circuit configured to produce the first signal, the logic circuit being supplied with the internal voltage in the first mode and supplied with the first voltage in the second mode.

20 Claims, 9 Drawing Sheets

US 9,136,844 B2

SEMICONDUCTOR DEVICE HAVING LEVEL SHIFTER

BACKGROUND OF THE INVENTION

1. Field of the Invention

The present invention relates to a semiconductor device, and more particularly to a semiconductor device that can stop generating an internal voltage.

2. Description of Related Art

In many semiconductor devices, an internal voltage is generated inside thereof based on an external voltage. The internal voltage is used to operate some circuit blocks. Even in this case, a circuit block that serves as an interface to outside needs to operate on the external voltage. As a result, a signal of a circuit that operates on the internal voltage is different in amplitude from a signal of a circuit block that operates on the external voltage. Therefore, a level shifter is inserted between the circuit blocks to convert the amplitude of the signals. In Japanese Patent Application Laid-Open No. 2004-153689 discloses a level shifter that includes a flip-flop latch circuit of a current mirror type and a CMOS inverter circuit.

Meanwhile, a DRAM (Dynamic Random Access Memory), which is one of typical semiconductor devices, has an operation mode called a deep power down mode (See Japanese Patent Application Laid-Open No. 2012-38389). The deep power down mode is an operation mode to minimize power consumption, as well as to maintain a standby state, by stopping operations of most of circuits in the DRAM. Once the DRAM enters the deep power down mode, the generation of internal voltage is also stopped, thereby stopping most of circuit blocks that are designed to operate on the internal voltage. However, even when the DRAM enters the deep power down mode, some circuit blocks that serve as an interface to the outside remain activated. The circuit blocks that serve as an interface to the outside are designed to operate on the external voltage. Therefore, for example, a level shifter disclosed in Japanese Patent Application Laid-Open No. 2004-153689 needs to be inserted between the circuit blocks operating on the external voltage and the circuit blocks operating on the internal voltage.

The present inventor has made extensive studies to improve a semiconductor device having an operation mode in which the generation of internal voltage is stopped as in the case of the deep power down mode.

SUMMARY

In one embodiment, there is provided a semiconductor device that includes: a first circuit configured to generate, when a control signal is activated, an internal potential based on a first power-supply potential and to supply the internal potential to an internal node, and stops generating the internal potential when the control signal is inactivated; a second circuit configured to supply a second power-supply potential to the internal node when the control signal is inactivated; and a third circuit operating on a potential supplied from the internal node to generate an output signal, the third circuit being configured to maintain a logical level of the output signal when the potential supplied from the internal node is changed from the internal potential to the second power-supply potential.

In another embodiment, there is provided a semiconductor device that includes: a first power-supply terminal supplied with a first power-supply potential; a second power-supply terminal supplied with a second power-supply potential different from the first power-supply potential; a third power-supply terminal supplied with a ground potential; a first circuit generating, when a control signal is in a first logical level, an internal potential that is different from the first power-supply potential based on one of the first and second power-supply potentials, and supplying the internal potential to an internal node; a second circuit supplying, when the control signal is in a second logical level different from the first logical level, the second power-supply potential to the internal node; and a third circuit operating on a first voltage that is applied between the internal node and the third power-supply terminal, and activated when the control signal is in the first logical level, and inactivated when the control signal is in the second logical level.

In still another embodiment, there is provided a semiconductor device that includes: an internal voltage generator configured to produce an internal voltage in a first mode and stop producing the internal voltage in a second mode; a level shifter configured to receive the internal voltage, a first voltage and a first signal, in order to convert the first signal from a voltage level of internal voltage to a voltage level of the first voltage and output the first signal with the voltage level of the first voltage; and a logic circuit configured to produce the first signal, the logic circuit being supplied with the internal voltage in the first mode and supplied with the first voltage in the second mode.

According to the present invention, what is provided is the second circuit that supplies a second power-supply potential, or external potential, to the first node. Therefore, even when the generation of internal voltage is stopped, an output signal output from the third circuit does not become undefined. Thus, it is possible to reduce current consumption of a circuit that is connected in the subsequent stage of the third circuit.

DETAILED DESCRIPTION OF THE EMBODIMENTS

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Before explaining preferred embodiments of the present invention, an explanation is made about the problems of the conventional device.

Figure 1:
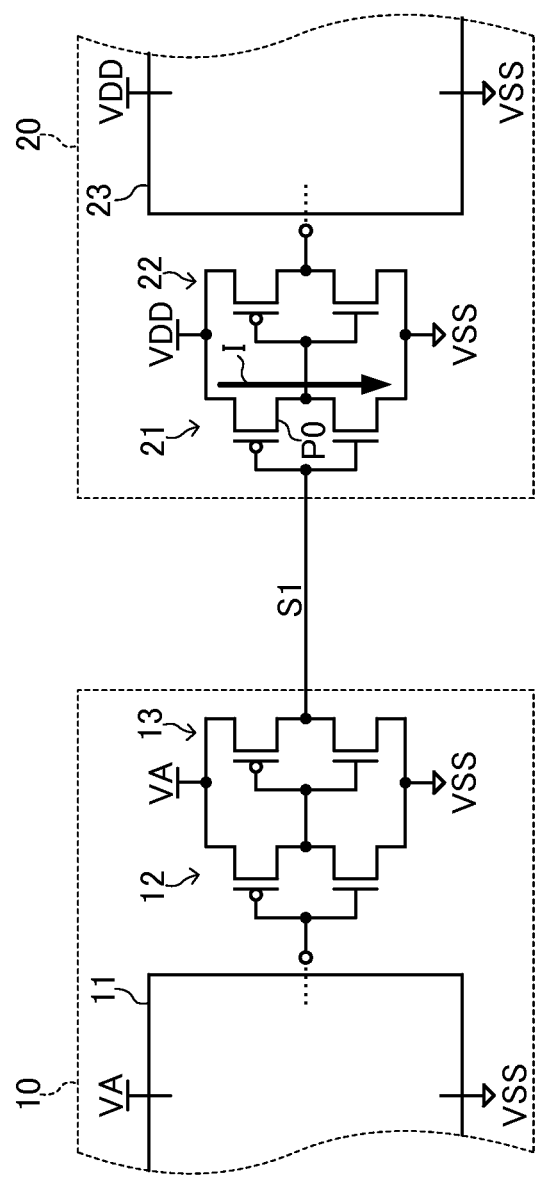
FIG. 1 is a circuit diagram showing an example in which two circuit blocks that operate on different power-supply voltages are connected to each other.

Referring now to FIG. 1, a circuit block 10 operates on a voltage between an internal potential VA and a ground potential VSS. A signal S1 is output from a main circuit section 11 via CMOS inverters 12 and 13. A circuit block 20 operates on a voltage between an external potential VDD and the ground potential VSS. The signal S1 is input into a main circuit section 23 via CMOS inverters 21 and 22. Incidentally, in the present specification, the voltage between the internal potential VA and the ground potential VSS may be referred to as "internal voltage VA"; the voltage between the external potential VDD and the ground potential VSS may be referred to as "external voltage VDD." The same is also applied to voltages between other power-supply potentials and the ground potential VSS.

The internal voltage VA is generated inside a device based on the external voltage VDD. A relationship between the internal voltage VA and the external voltage VDD is as follows:

$$VA < VDD$$

In this case, the maximum amplitude of the signal S1 output from the circuit block 10 is VA. If the signal S1 is supplied to the circuit block 20 without being changed in amplitude, a penetration current I flows through the first-stage CMOS inverter 21. The reason is that, if the logical level of the signal S1 is H-level, or if the potential is VA, the gate potential of a PMOS transistor P0 (=VA) is lower than the source potential thereof (=VDD); and that the PMOS transistor P0 cannot be completely turned OFF. To solve such a problem, a level shifter needs to be inserted between the circuit block 10 and the circuit block 20.

Figure 2:
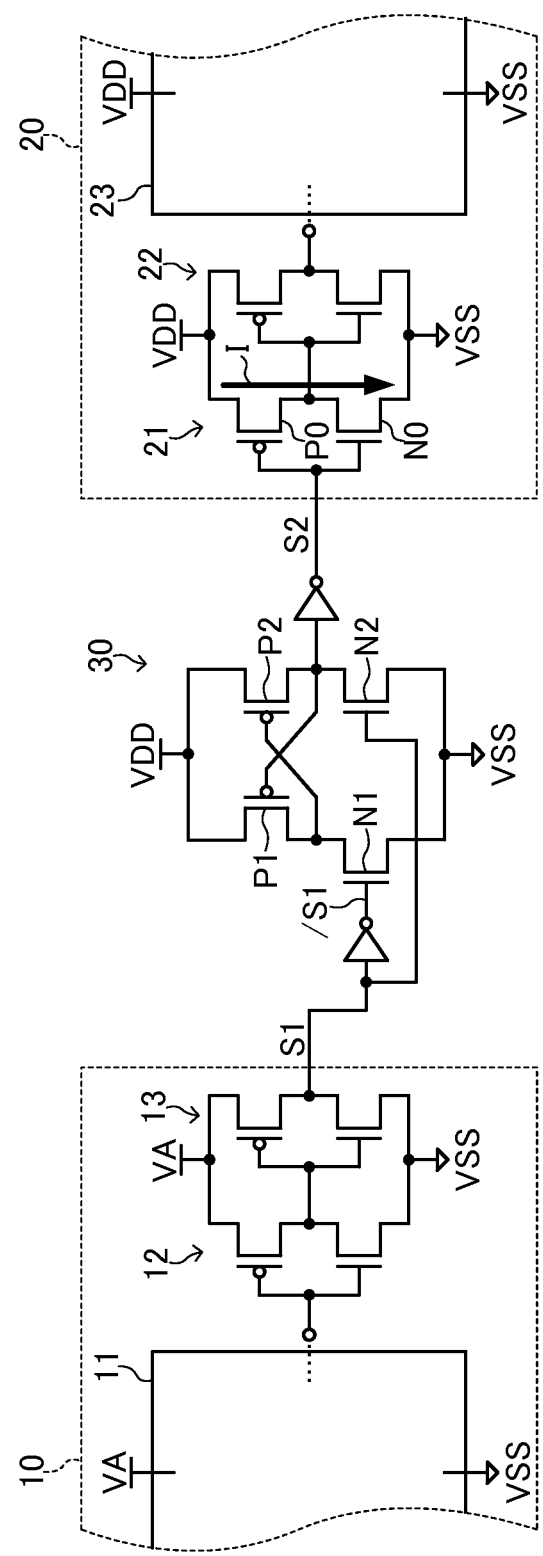
FIG. 2 is a circuit diagram showing an example in which a level shifter is inserted between two circuit blocks.

Turning to FIG. 2, a level shifter 30 is inserted between the circuit block 10 and the circuit block 20.

The level shifter 30 shown in FIG. 2 includes a flip-flop latch circuit of a current mirror type disclosed in Japanese Patent Application Laid-Open No. 2004-153689. To gate electrodes of NMOS transistors N1 and N2, complementary signals /S1 and S1 are supplied, respectively. The level shifter 30 is a level-conversion circuit that converts the complementary signals S1 and /S1 with an amplitude of VA into signals S2 with an amplitude of VDD. The level-converted signals S2 are supplied to the circuit block 20. As a result, the PMOS transistor P0, which is part of the first-stage CMOS inverter 21, can be completely turned OFF, and the penetration current can be prevented from occurring.

Incidentally, if the relation between the internal voltage VA and the external voltage VDD is:

$$VA \geq VDD$$

then the PMOS transistor P0 of the CMOS inverter 21 can be completely turned OFF even in the case of the configuration shown in FIG. 1. Therefore, the level shifter 30 may not be required. However, even in this case, it is preferred that the level shifter 30 be inserted as shown in FIG. 2 in case a higher voltage is applied as power-supply voltage VDD due to arbitrary settings or specification changes after product shipment.

Then, the present inventor has studied how the internal voltage VA supplied to the circuit block 10 is stopped in a deep power down mode, as described in Japanese Patent Application Laid-Open No. 2004-153689. Once the device enter the deep power down mode, the generation of the internal voltage VA is stopped. As a result, all power-supply nodes inside the circuit block 10 come down to the ground potential VSS. Accordingly, the final-stage CMOS inverter 13 of the circuit block 10 stops operating, and an output terminal thereof is brought into a floating state. At this time, if the logical level of the signal S1 is L-level before stopping the generation of the internal voltage VA, the L-level is maintained. However, if the logical level of the signal S1 is H-level before stopping the generation of the internal voltage VA, the electric charge fades gradually, and the logical level comes down to L-level. As a result, as both the signals S1 and /S1 that are supplied into the level shifter 30 become L-level, either the PMOS transistor P1 or P2 cannot be completely turned OFF. As a result, the level of the signal S2 become undefined. Therefore, the PMOS transistor P0 or NMOS transistor N0 cannot be completely turned OFF and resulting in the penetration current I. The present inventor therefore have studied a level shifter that can fix the logical level of the signal S2 when the circuits enter the deep power down mode.

Figure 3:
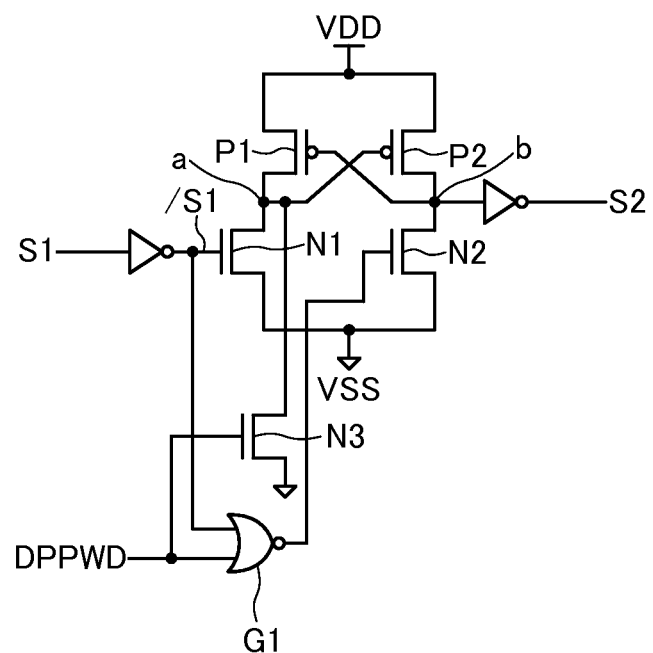
FIG. 3 is a circuit diagram of an improved level shifter.

Turning to FIG. 3, the level shifter 30A has a circuit configuration that is made by adding a NMOS transistor N3 and a NOR gate circuit G1 to the level shifter 30 shown in FIG. 2. The NMOS transistor N3 is connected between a node a and the ground potential VSS. A gate electrode of the NMOS transistor N3 is supplied with a deep power down signal DPPWD. The deep power down signal DPPWD is a signal that is at L-level during a normal operation, and at H-level during the deep power down mode. In the present Specification, the deep power down signal DPPWD may be referred to as "first signal." The node a is a contact point between the PMOS transistor P1 and the NMOS transistor N1. A signal /S2 is output from a node b that is a contact point between the PMOS transistor P2 and the NMOS transistor N2. The signal /S2 is then supplied to the circuit block 20 via an inverter.

The NOR gate circuit G1 receives the output signal /S1 from the circuit block 10 and the deep power down signal DPPWD to supply a NOR-operation output signal thereof to the gate electrode of the NMOS transistor N2.

The following describes an operation of the level shifter 30A. First, during the normal operation, the deep power down signal DPPWD is at L-level. Therefore, the NMOS transistor N3 is in an OFF state, having no impact on the node a. The NOR gate circuit G1 outputs an inverted signal of the signal /S1, i.e. the signal S1. Therefore, during the normal operation, the level shifter 30A operates in the same way as the level shifter 30 shown in FIG. 2.

During the deep power down mode, the deep power down signal DPPWD is at H-level. Therefore, the NMOS transistor N3 turns ON. As a result, the node a is fixed to the ground potential VSS, and the PMOS transistor P2 to an ON state. Moreover, the output signal of the NOR gate circuit G1 is at L-level. Therefore, the NMOS transistor N2 turns OFF. Accordingly, regardless of the level of the signal S1 from the circuit block 10, the node b is fixed to the power-supply potential VDD. As a result, during the deep power down mode, the signal S2 output from the level shifter 30A is fixed to L-level, and no penetration current I flows in the first stage of the circuit block 20.

However, for the level shifter 30A shown in FIG. 3, the transistor N3 and the NOR gate circuit G1 need to be added to the level shifter 30 shown in FIG. 2. Therefore, there is still room for further improvement in terms of how to save the area of the semiconductor chip. Incidentally, FIGS. 1 to 3 have been described with a focus on the one-bit signal that is supplied from the circuit block 10 to the circuit block 20. However, in an actual device, a large number of signals are supplied from the circuit block 10 to the circuit block 20. The number of level shifters 30A provided needs to be equal to the number of signal lines. Therefore, an increase in the area that comes with the use of the improved level shifter 30A cannot be ignored.

The above are problems that the present inventor has studied. The present embodiment is intended to provide a semiconductor device capable of solving such problems. The following describes some preferred embodiments of the present invention.

A configuration of a semiconductor device 100 according to a preferred embodiment of the present invention will be explained with reference to FIG. 4. The semiconductor device 100 of the present embodiment is DRAM. However, the application of the present invention is not limited to DRAM. The present invention may be applied to other semiconductor memory devices, such as SRAM, ReRAM and flash memory, as well as to logic semiconductor devices, such as CPU and DSP.

Figure 4:
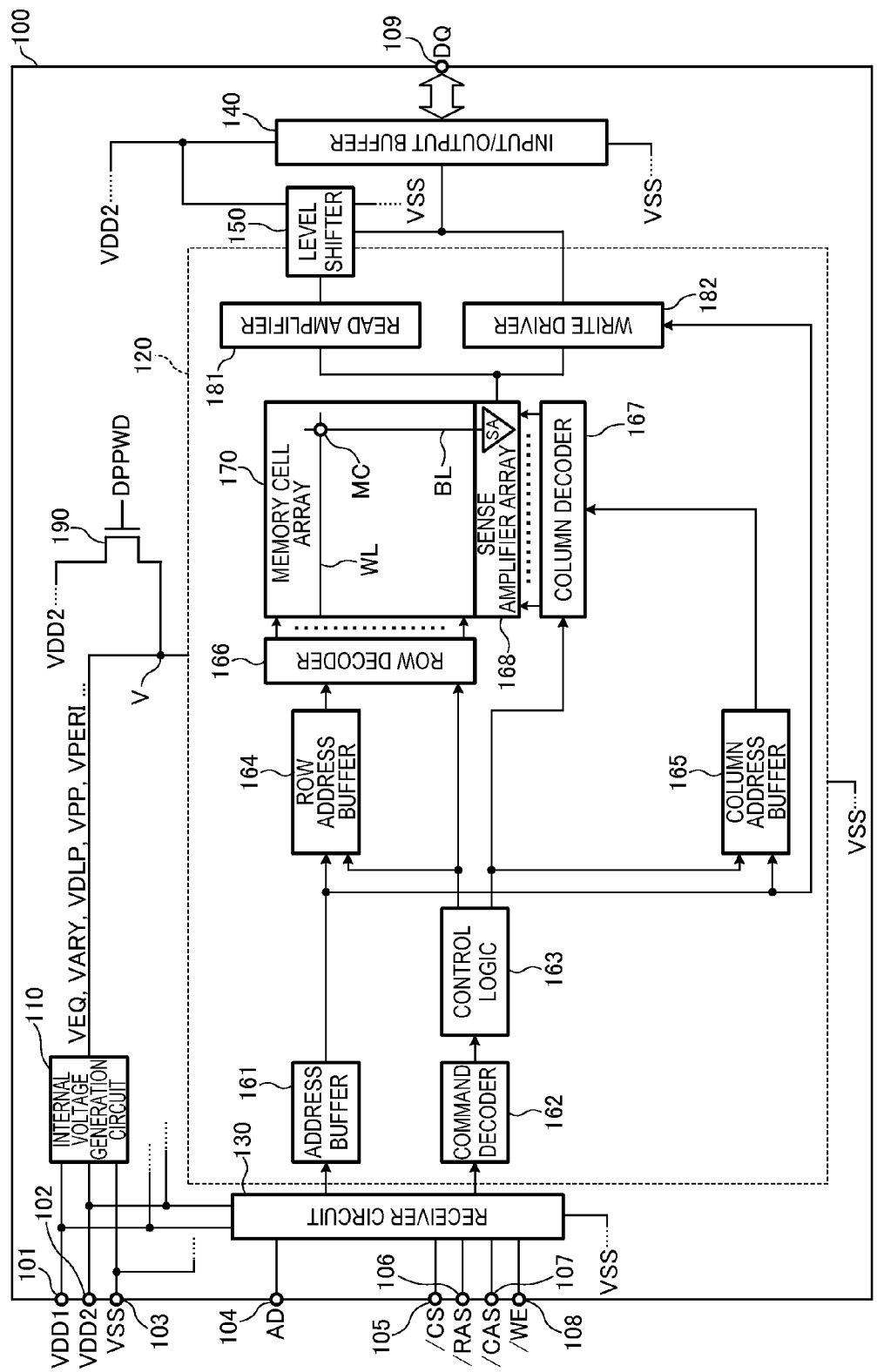
FIG. 4 is a block diagram showing the configuration of a semiconductor device according to a preferred embodiment of the present invention.

As shown in FIG. 4, the semiconductor device 100 of the present embodiment includes a plurality of external terminals including power-supply terminals 101 to 103, an address terminal 104, command terminals 105 to 108, and a data terminal 109. The semiconductor device 100 also actually include a clock terminal, a calibration terminal, and other external terminals; however, the external terminals are not shown in the diagram since the terminals are not related directly to the subject matter of the present invention.

The power-supply terminals 101 to 103 are supplied with the external potentials VDD1 and VDD2 and the ground potential VSS, respectively, from the outside. According to the present embodiment, the relation between the potentials is as follows:

VDD1>VDD2>VSS

The power-supply potentials that are supplied via the power-supply terminals 101 to 103 are supplied to an internal voltage generation circuit 110. The internal voltage generation circuit 110 generates various internal potentials VA based on the potentials. The internal potentials VA include VEQ, VARY, VDLP, VPP, and VPERI. The internal potential VEQ is a potential that is used to equalize a sense amplifier described later. The internal potential VARY is a H-level potential of a bit line described later. The internal potential VDLP is a constant potential that is supplied to a delay circuit. The internal potential VPP is an activation potential for a word line described later. The internal potential VPERI is an operation potential for most of peripheral circuits. The internal potentials are supplied to a main circuit block 120 of the semiconductor device 100. Therefore, the circuit block 120 is a circuit block that operates on the internal voltage VA.

A receiver circuit 130 and an input/output buffer 140 are circuit blocks that serve as an interface to the outside. Therefore, the receiver circuit 130 and the input/output buffer 140 operate on external voltages. As shown in FIG. 4, the external potentials VDD1 and VDD2 and the ground potential VSS are supplied to the receiver circuit 130, and the external potential VDD2 and the ground potential VSS to the input/output buffer 140.

The receiver circuit 130 is a circuit block to which address signals AD and command signals CMD are supplied via the address terminal 104 and the command terminals 105 to 108. The command signals CMD include a chip select signal /CS, a row address strobe signal /RAS, a column address strobe signal /CAS, and a write enable signal /WE. The signals /CS, /RAS, /CAS and /WE are supplied via the command terminals 105 to 108, respectively. The receiver circuit 130 receives the address signals AD and the command signals CMD, and converts the amplitude of the signals into the amplitude of the internal voltage VA. The address signals AD received by the receiver circuit 130 are supplied to an address buffer 161, and the command signals CMD to a command decoder 162.

The command decoder 162 decodes the command signals CMD to generate various internal commands, and supplies the internal commands to a control logic 163. The control logic 163 controls the operations of a row address buffer 164, column address buffer 165, row decoder 166, column decoder 167, and the like based on the internal commands supplied from the command decoder 162.

More specifically, when the internal command indicates row access, the address signal AD output from the address buffer 161 is captured by the row address buffer 164. As a result, the address signal AD is supplied to the row decoder 166, and the row decoder 166 activates one of word lines WL contained in a memory cell array 170. When the internal command indicates column access, the address signal AD output from the address buffer 161 is captured by the column address buffer 165. As a result, the address signal AD is supplied to the column decoder 167, and the column decoder 167 connects one of sense amplifiers SA contained in a sense amplifier array 168 to a read amplifier 181 or write driver 182. The sense amplifier SA is connected to a corresponding pair of bit lines BL in the memory cell array 170, and is designed to amplify a difference in potential that occurs between the bit lines BL. FIG. 4 shows only one word line WL, one bit line BL, and one memory cell MC connected to the word and bit lines, in the memory cell array 170. However, the memory cell array 170 actually contains lager numbers of word lines, bit lines BL, and memory cells MC.

Data DQ that are read from the memory cell array 170 via the read amplifier 181 are supplied to the input/output buffer 140 via a level shifter 150, and are output to the outside via the data terminal 109. The level shifter 150 is a circuit that converts data having the amplitude of the internal voltage VA to data having the amplitude of the external voltage VDD2. Data DQ that are supplied to the input/output buffer 140 via the data terminal 109 are supplied to the memory cell array 170 via the write driver 182.

As shown in FIG. 4, a node V from which an operation voltage is supplied to the circuit block 120 is connected to the power-supply terminal 102 via a voltage switching circuit 190. The power-supply terminal 102 is supplied with the power-supply potential VDD2. The voltage switching circuit 190 is controlled to be ON/OFF depending on the deep power down signal DPPWD. As described above, the deep power down signal DPPWD is at L-level during the normal operation, and at H-level during the deep power down mode. The deep power down signal DPPWD is output from the control logic 163. The following describes in more detail how the potential supplied to the node V is controlled.

A configuration of the internal voltage generation circuit 110 according to the first embodiment will be explained with reference to FIG. 5. The present embodiment is effective when the level of the internal potential VA is less than that of the external potential VDD1, and is equal to or greater than that of the external potential VDD2.

Figure 5:
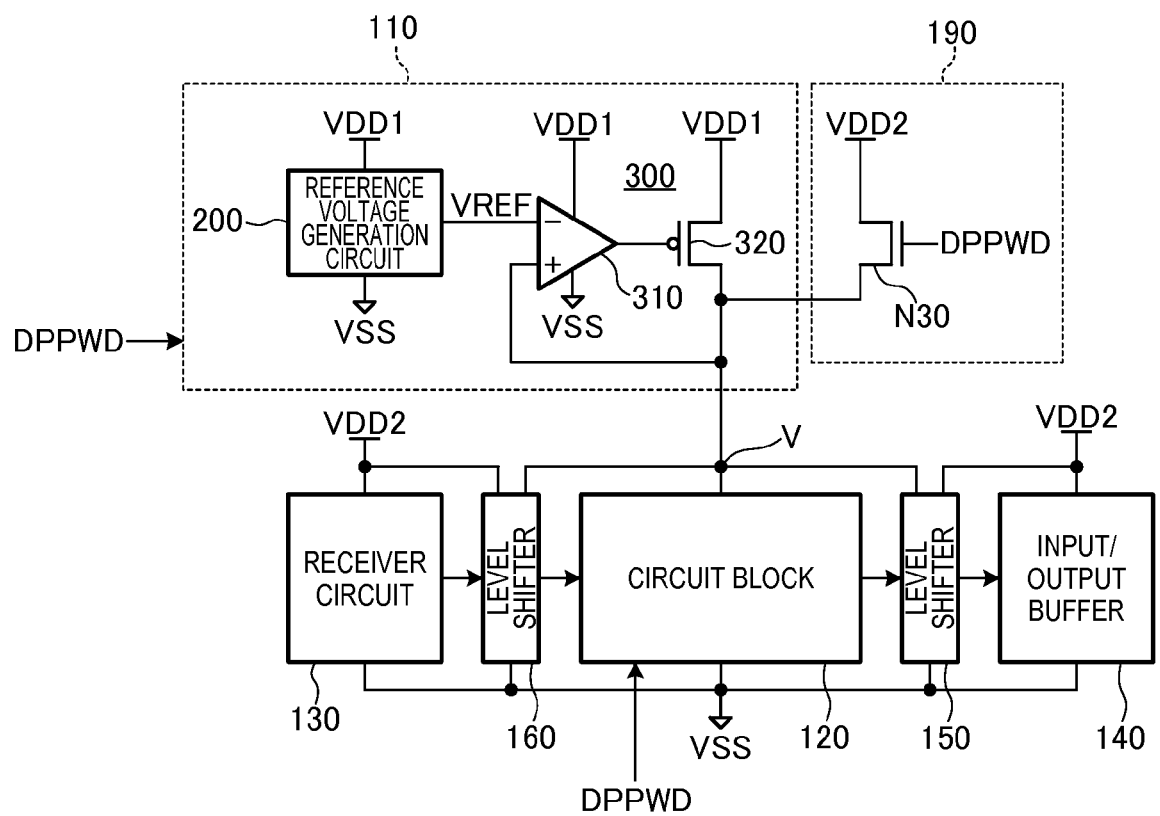
FIG. 5 is a block diagram showing the configuration of the internal voltage generation circuit according to a first embodiment of the present invention.

As shown in FIG. 5, the internal voltage generation circuit 110 includes a reference voltage generation circuit 200 that generates a reference potential VREF, and a step-down circuit 300 that generates the internal potential VA by stepping down the external potential VDD1 based on the reference potential VREF. The step-down circuit 300 includes a differential circuit 310 or operation amplifier and a driver circuit 320. The circuits 310 and 320 will be described later in detail. To the internal voltage generation circuit 110, the deep power down signal DPPWD, which is activated during the deep power down mode, is supplied. When the deep power down signal DPPWD is activated, the internal voltage generation circuit 110 becomes inactivated, and the generation of the internal voltage VA is stopped. Instead, the voltage switching circuit 190 is turned ON. Therefore, when the semiconductor device 100 enter the deep power down mode, the external potential VDD2 is supplied directly to the node V.

In the present Specification, the internal voltage generation circuit 110 may be referred to as "first circuit", and the voltage switching circuit 190 may be referred to as "second circuit." The power-supply potential supplied to the internal voltage generation circuit 110 may be referred to as "first power-supply potential", and the power-supply potential supplied to the voltage switching circuit 190 may be referred to as "second power-supply potential." Therefore, according to the present embodiment, the external potential VDD1 is the "first power-supply potential" and the external potential VDD2 is the "second power-supply potential."

The deep power down signal DPPWD is also supplied to the circuit block 120 that operates on the internal voltage VA. When the semiconductor device 100 enters the deep power down mode, the operation of the circuit block 120 is stopped. As shown in FIG. 4, the circuit block 120 contains the memory cell array 170. When the semiconductor device 100 enters the deep power down mode, data retained by the memory cell array 170 are discarded. The reason is because the semiconductor device 100 of the present embodiment is DRAM, and the memory cells MC are volatile memory cells.

As shown in FIG. 5, a level shifter 160 is inserted between the receiver circuit 130 and the circuit block 120. A level shifter 150 is inserted between the circuit block 120 and the input/output buffer 140. The reason is that, while the circuit block 120 operates on the internal voltage VA, the receiver circuit 130 and the input/output buffer 140 operate on the external potential VDD2. Therefore, the amplitudes of signals are different from each other. In the present Specification, the circuit block 120 may be referred to as "third circuit", the input/output buffer 140 may be referred to as "fourth circuit", and the level shifter 150 may be referred to as "fifth circuit." As for the receiver circuit 130 and the input/output buffer 140, even when the semiconductor device 100 enters the deep power down mode, at least some circuits remain activated, thereby making it possible for the semiconductor device 100 to return from the deep power down mode in response to a signal from the outside.

Figure 6:
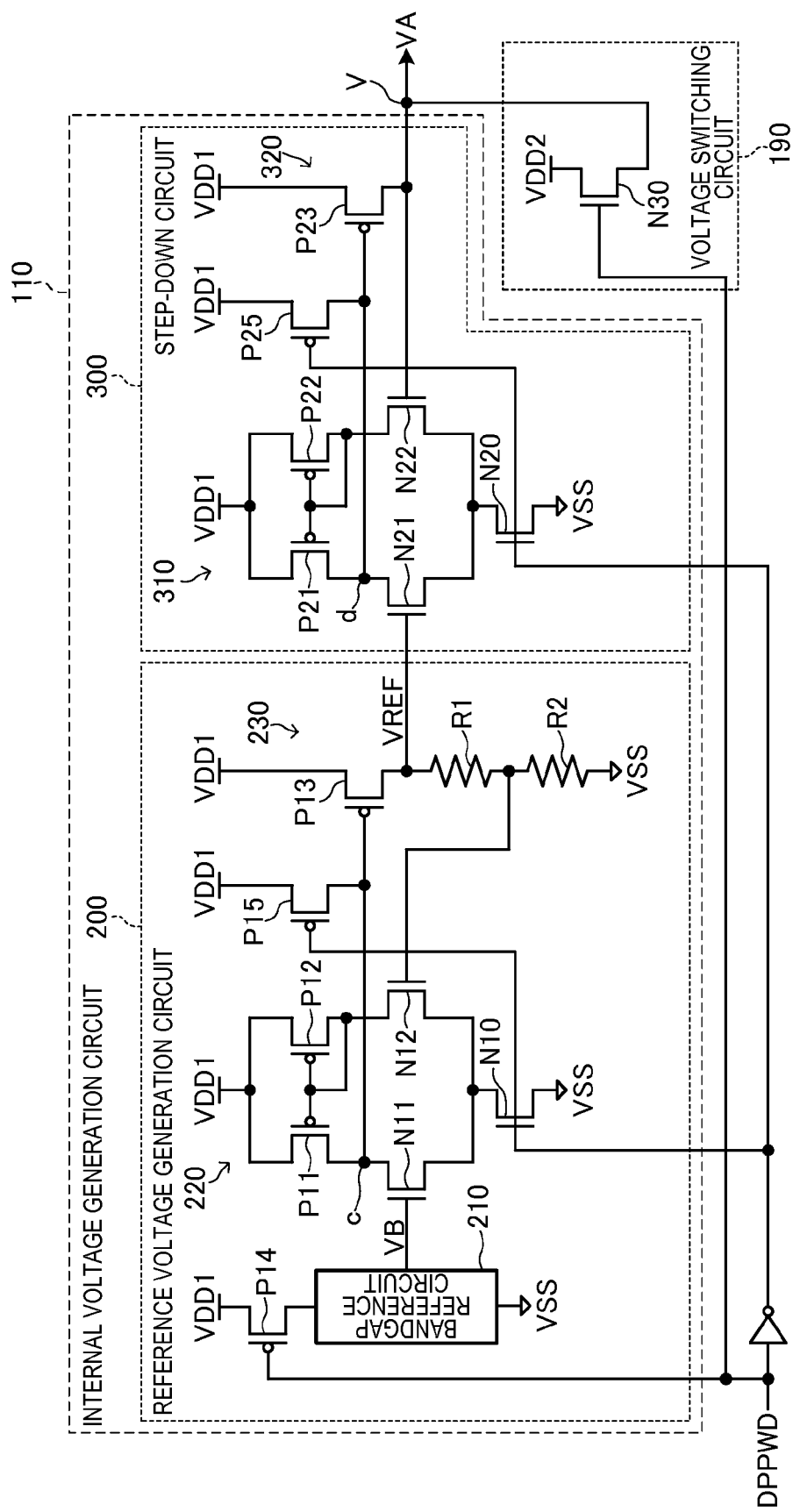
FIG. 6 is a circuit diagram of the internal voltage generation circuit shown in FIG. 5.

Turning to FIG. 6, the reference voltage generation circuit 200 contained in the internal voltage generation circuit 110 includes a bandgap reference circuit 210 that generates a bandgap potential VB, a differential circuit 220 that receives the bandgap potential VB, and an output stage circuit 230 that receives an output signal of the differential circuit 220. The circuits 210, 220, and 230 operate on the external voltage VDD1. Accordingly, the circuits 210, 220, and 230 are connected between the power-supply terminal 101 to which the external potential VDD1 is supplied, and the power-supply terminal 103 to which the ground potential VSS is supplied.

The bandgap reference circuit 210 generates a bandgap potential VB, which is a constant potential that is not dependent on voltages or temperatures. The bandgap potential VB is supplied to the gate electrode of one NMOS transistor N11 included in the differential circuit 220. The differential circuit 220 includes a pair of NMOS transistors N11 and N12, a pair of PMOS transistors P11 and P12 that are connected to the NMOS transistors N11 and N12, respectively, in a way that forms a current mirror structure, and a NMOS transistor N10 that supplies an operation current. A node c, which is a contact point of the PMOS transistor P11 and NMOS transistor N11, is an output node of the differential circuit 220, and is connected to the gate electrode of a PMOS transistor P13 included in the output stage circuit 230.

The output stage circuit 230 has a structure in which the PMOS transistor P13 and resistive elements R1 and R2 are connected in series between the power-supply terminals 101 and 103. The potential at the contact point of the resistive elements R1 and R2 is fed back to the gate electrode of the NMOS transistor N12. According to the above configuration, the reference potential VREF output from the reference voltage generation circuit 200 is a constant value, which is determined based on the level of the bandgap potential VB and the resistance values of the resistive elements R1 and R2. The resistance values of the resistive elements R1 and R2 are so selected that the level of the target internal potential VA is equal to the reference potential VREF.

As shown in FIG. 6, a PMOS transistor P14 is connected between the bandgap reference circuit 210 and the power-supply terminal 101. To the gate electrode of the PMOS transistor P14, the deep power down signal DPPWD is supplied. Therefore, when the semiconductor device 100 enters the deep power down mode, the bandgap reference circuit 210 is disconnected from the power-supply terminal 101, and the amount of current consumed by the bandgap reference circuit 210 becomes almost zero.

Moreover, an inverted signal of the deep power down signal DPPWD is supplied to the gate electrode of the NMOS transistor N10 in the differential circuit 220. When the semiconductor device 100 enters the deep power down mode, the NMOS transistor N10 is completely turned OFF, and the amount of current consumed by the differential circuit 220 becomes almost zero.

Furthermore, a PMOS transistor P15 is connected between the output node c of the differential circuit 220 and the power-supply terminal 101. To the gate electrode of the PMOS transistor P15, an inverted signal of the deep power down signal DPPWD is supplied. Therefore, when the semiconductor device 100 enters the deep power down mode, the external potential VDD1 is supplied to the gate electrode of the PMOS transistor P13. As a result, the PMOS transistor P13 is completely turned OFF, and the amount of current consumed by the output stage circuit 230 becomes almost zero.

In that manner, the reference voltage generation circuit 200 generates, during the normal operation, the reference potential VREF that is equal to the internal potential VA to be generated. During the deep power down mode, the reference voltage generation circuit 200 becomes inactivated, and the amount of current consumed by the reference voltage generation circuit 200 becomes almost zero.

As shown in FIG. 6, the step-down circuit 300 in the internal voltage generation circuit 110 includes a differential circuit 310 and a driver circuit 320. The differential circuit 310 includes a pair of NMOS transistors N21 and N22, a pair of PMOS transistors P21 and P22 that are connected to the NMOS transistors N21 and N22, respectively, in a way that forms a current mirror structure, and a NMOS transistor N20 that supplies an operation current. To the gate electrode of the NMOS transistor N21, the reference potential VREF is supplied. The gate electrode of the NMOS transistor N22 is connected to the node V. A node d, which is a contact point of the PMOS transistor P21 and NMOS transistor N21, is an output node of the differential circuit 310, and is connected to the gate electrode of a PMOS transistor P23 that makes up the driver circuit 320.

According to the above configuration, the differential circuit 310 controls the driver circuit 320 in such a way that the internal potential VA applied to the node V becomes equal to the reference potential VREF. The inverted signal of the deep power down signal DPPWD is supplied to the gate electrode of the NMOS transistor N20 in the differential circuit 310. Accordingly, when the semiconductor device 100 enters the deep power down mode, the NMOS transistor N20 is completely turned OFF, bringing the amount of current consumed by the differential circuit 310 down to almost zero.

Furthermore, the PMOS transistor P25 is connected between the output node d of the differential circuit 310 and the power-supply terminal 101. To the gate electrode of the PMOS transistor P25, the inverted signal of the deep power down signal DPPWD is supplied. Accordingly, when the semiconductor device 100 enters the deep power down mode, the external potential VDD1 is supplied to the gate electrode of the PMOS transistor P23. As a result, the PMOS transistor P23 is completely turned OFF, bringing the amount of current consumed by the driver circuit 320 down to almost zero.

In this manner, the step-down circuit 300 supplies, during the normal operation, the internal potential VA whose level is equal to that of the reference potential VREF to the node V. During the deep power down mode, the step-down circuit 300 is inactivated, and the amount of current consumed by the step-down circuit 300 becomes almost zero.

As shown in FIGS. 4 to 6, the voltage switching circuit 190 is connected to the node V. The voltage switching circuit 190 includes the NMOS transistor N30, which is connected between the power-supply terminal 120 supplied with the power-supply potential VDD2 and the node V. To the gate electrode of the NMOS transistor N30, the deep power down signal DPPWD is supplied. Therefore, the NMOS transistor N30 is OFF during the normal operation, and ON during the deep power down mode. As described above, in the deep power down mode, the internal voltage generation circuit 110 is completely inactivated, and the driving of the node V by the internal voltage generation circuit 110 is therefore stopped. Instead, the voltage switching circuit 190 is activated, and the external potential VDD2 is supplied to the node V instead of the internal potential VA. As a result, after the semiconductor device 100 enters the deep power down mode, the external potential VDD2 is supplied to the circuit block 120. However, during a period of time when the semiconductor device 100 is in the deep power down mode, all the transistors in the circuit block 120 do not perform switching. Therefore, almost no power is consumed.

Figure 7:
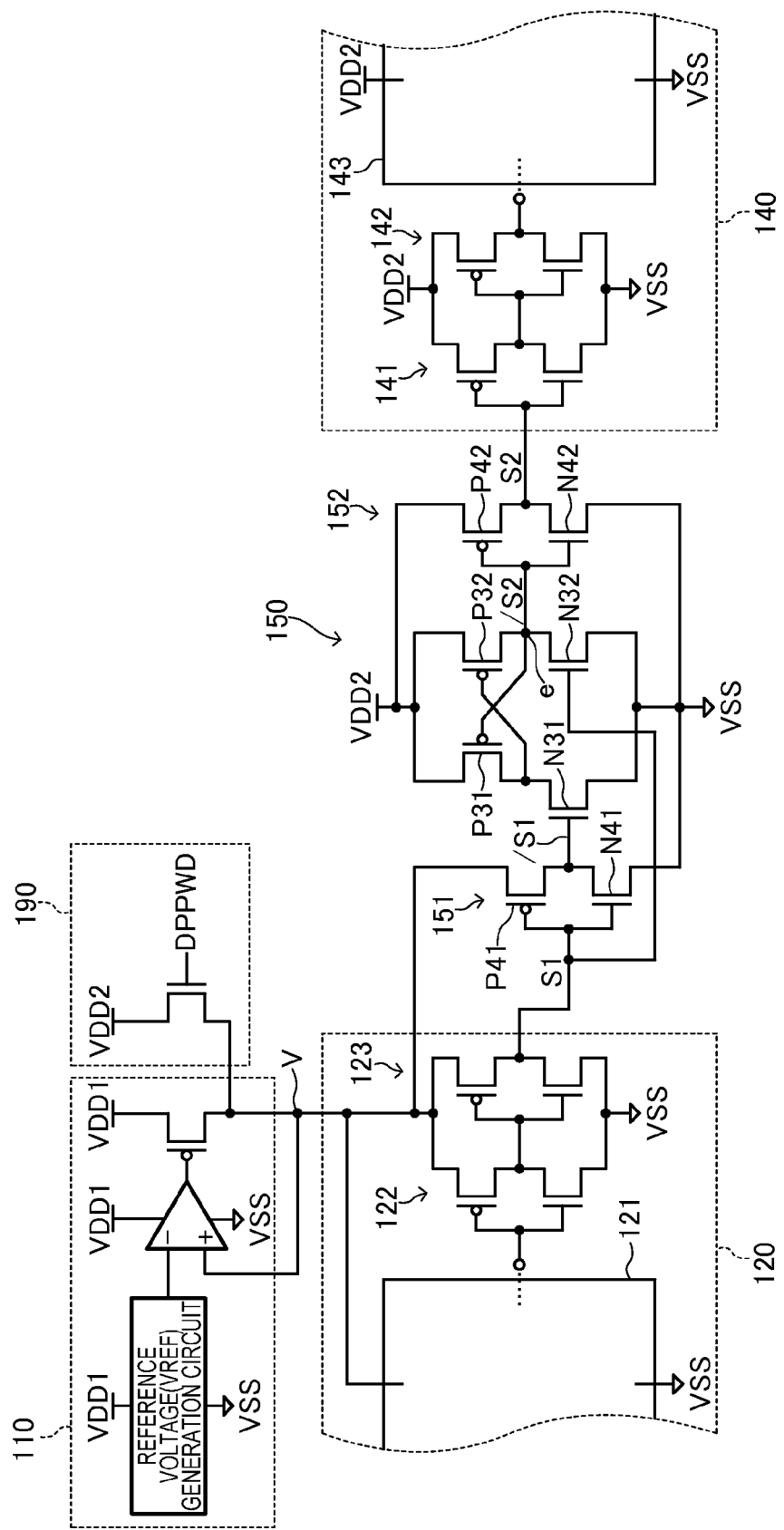
FIG. 7 is a circuit diagram of the level shifter shown in FIG. 5.

Turning to FIG. 7, the circuit configuration of the level shifter 150 is basically the same as that of the level shifter 30 shown in FIG. 2. That is, the level shifter 150 includes a flip-flop latch circuit of a current mirror type that includes PMOS transistors P31 and P32, and NMOS transistors N31 and N32. To the gate electrodes of the NMOS transistors N31 and N32 that are paired, complementary signals /S1 and S1 are supplied. The signal S1 is an output signal from the circuit block 120, and is output from a main circuit section 121 via CMOS inverters 122 and 123. An inverter 151 that is designed to invert the signal S1 includes a PMOS transistor P41 and a NMOS transistor N41, and operates on a voltage between a potential supplied to a node V and the ground potential VSS. As described above, the circuit block 120 is a circuit block that stops operating when the semiconductor device 100 enters the deep power down mode.

A node e, which is a contact point between the PMOS transistor P32 and the NMOS transistor N32, is an output node of the level shifter 150, and is connected to an input node of an inverter 152. The signal S2 output from the inverter 152 is supplied to the input/output buffer 140, and is supplied to a main circuit section 143 via CMOS inverters 141 and 142. The inverter 152 that is designed to invert the signal /S2 includes a PMOS transistor P42 and a NMOS transistor N42, and operates on a voltage between the power-supply potential VDD2 and the ground potential VSS. As described above, the input/output buffer 140 is a circuit block that does not stop operating even as the semiconductor device 100 enters the deep power down mode.

The following describes an operation of the level shifter 150.

When the signal S1 is at H-level, the NMOS transistor N31 of the level shifter 150 turns OFF, and the NMOS transistor turns N32 ON. Since the amplitude of signals applied to the gate electrodes of the NMOS transistors N31 and N32 is VA during the normal operation, the NMOS transistors N31 and N32 are so designed as to be turned ON or OFF when the amplitude is VA. When the NMOS transistors N31 and N32 are turned OFF and ON, respectively, the PMOS transistors P31 and P32 are turned ON and OFF, respectively. As a result, the level of the node e becomes equal to the ground potential VSS. Thus, the PMOS transistor P42 of the inverter 152 is turned ON, and the level of the signal S2 becomes equal to the power-supply potential VDD2.

When the signal S1 is at L-level, the operation is the opposite of the above-described one. The NMOS transistors N31 and N32 are turned ON and OFF, respectively, and the PMOS transistors P31 and P32 are turned OFF and ON, respectively. Accordingly, the level of the node e becomes equal to the power-supply potential VDD2. As the NMOS transistor N42 of the inverter 152 is turned ON, the level of the signal S2 becomes equal to the ground potential VSS.

In that manner, the signal S1 with an amplitude of VA is level-converted into the signal S2 with an amplitude of VDD2. As a result, no penetration current flows through the first-stage CMOS inverter 141 of the input/output buffer 140.

Furthermore, in the semiconductor device 100 of the present embodiment, when the semiconductor device 100 enters the deep power down mode, the supply of power to the reference voltage generation circuit 200, which is part of the internal voltage generation circuit 110, as well as to the step-down circuit 300 and other circuits, is stopped. A source of current to differential amplifiers of the above circuits is also stopped. In this manner, the amount of current consumed during the deep power down mode is reduced.

The semiconductor device 100 of the present embodiment includes the voltage switching circuit 190. When the semiconductor device 100 enters the deep power down mode from the normal operation mode, the potential supplied to the node V is switched from the internal potential VA to the external potential VDD2. Accordingly, the logical level of the signal S1 output from the circuit block 120 remains equal to the previous logical level that appears before the semiconductor device 100 enters the deep power down mode. Therefore, to the level shifter 150, the complementary signals S1 and /S1 are properly supplied. As a result, the level of the signal S2 that is supplied to the first-stage CMOS inverter 141 of the input/output buffer 140 is properly maintained. Thus, even as the semiconductor device 100 enters the deep power down mode, no penetration current flows. Moreover, according to the configuration of the present embodiment, a reduction in current consumption, which is described above, can be achieved without adding logic gates and other circuits to the level shifter 150. Therefore, it is possible to reduce the area of a chip that makes up the semiconductor device.

Figure 8:
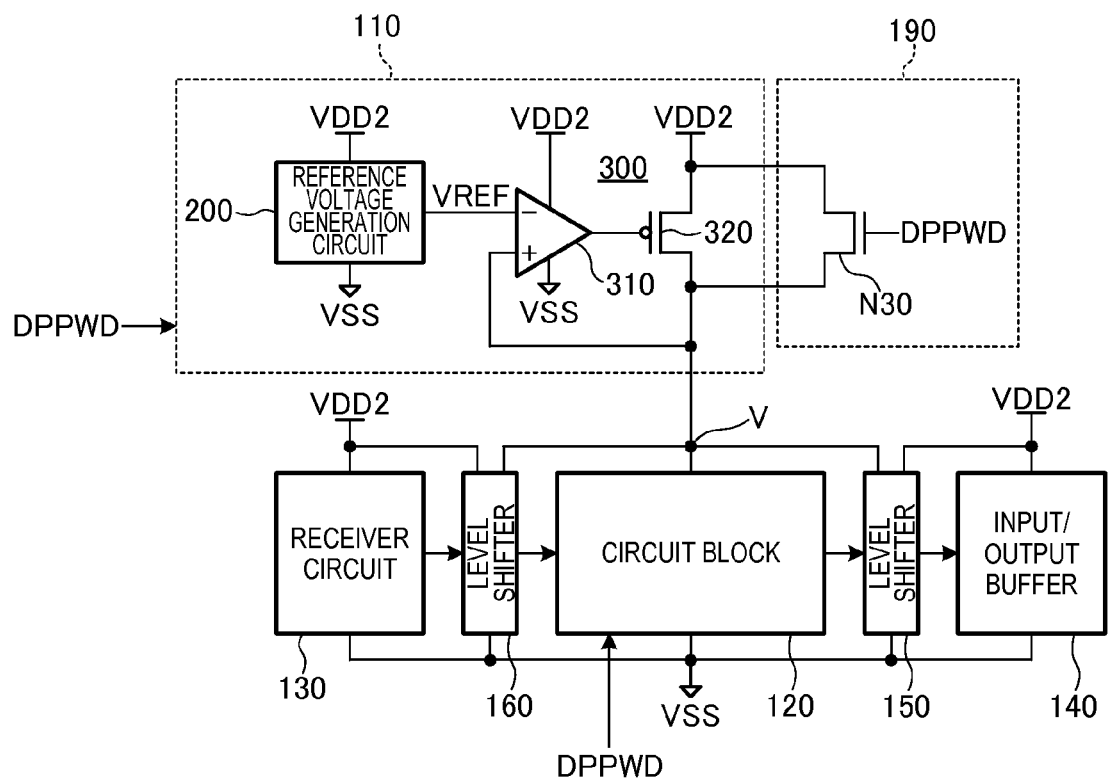
FIG. 8 is a block diagram showing the configuration of the internal voltage generation circuit according to a second embodiment of the present invention.

The following describes a second embodiment of the present invention with reference to FIG. 8.

As shown in FIG. 8, the second embodiment of the present invention is different from the first embodiment in that the power-supply potential supplied to the internal voltage generation circuit 110 is VDD2. That is, according to the present embodiment, the same power-supply potential is supplied from the same power-supply terminal 102 to the internal voltage generation circuit 110 and the voltage switching circuit 190. The other components are the same as those in the first embodiment. Therefore, the same components are represented by the same reference symbols, and a duplicate description will be omitted. The present embodiment is effective in the case where the level of the internal potential VA to be generated is lower than that of the external potential VDD2. According to the present embodiment, two-system power-supply potentials VDD1 and VDD2 are not necessarily required. The power-supply terminal 101 to which the power-supply potential VDD1 is supplied may be omitted.

According to the present embodiment, after the semiconductor device 100 enters the deep power down mode, the power-supply potential VDD2 is supplied directly to the node V. Therefore, it is possible to reduce the amount of current consumed by the internal voltage generation circuit 110, and to make the level shifter 150 operate properly.

The third embodiment of the present invention will be explained with reference to FIG. 9.

Figure 9:
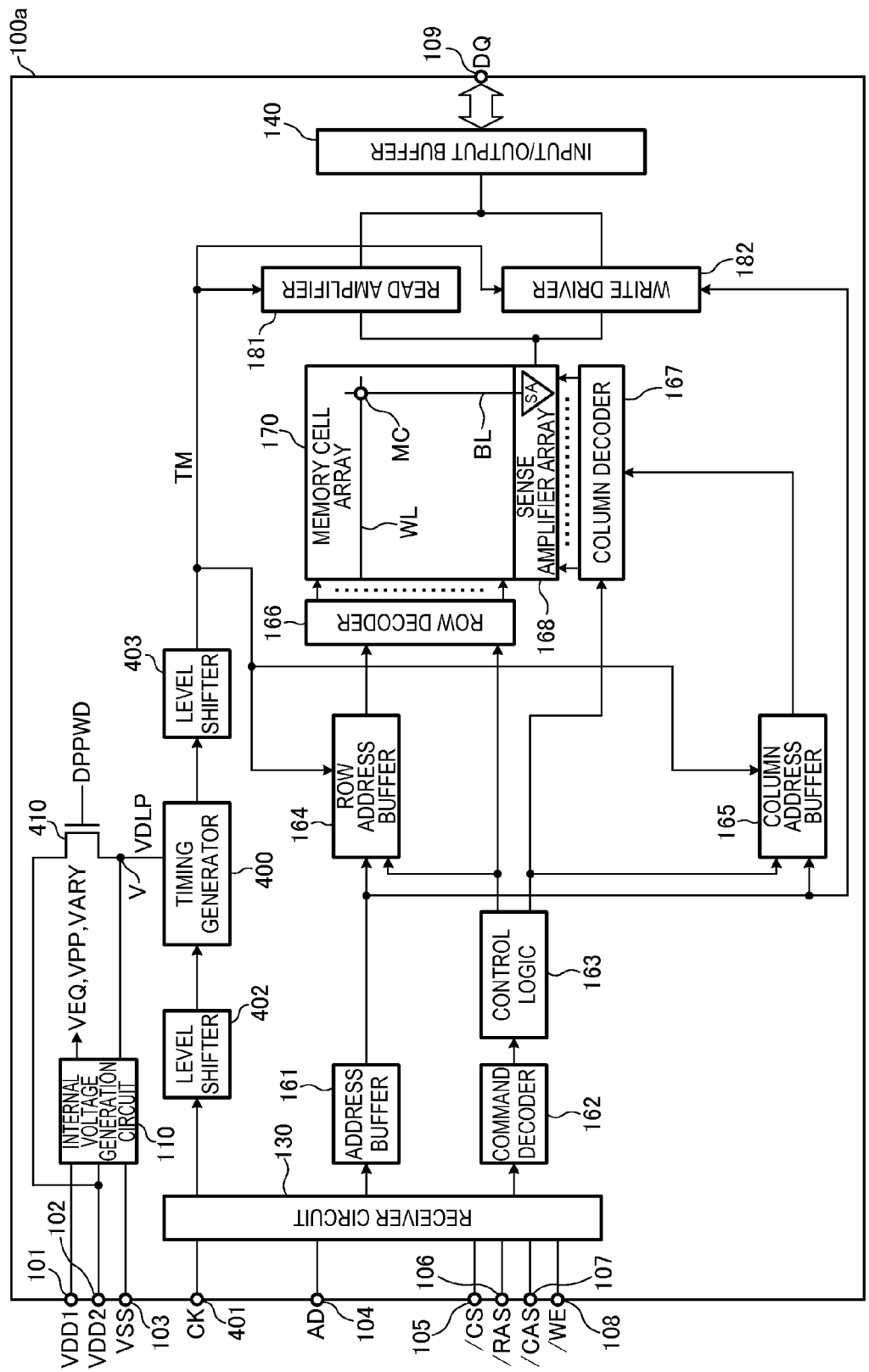
FIG. 9 is a block diagram showing the configuration of a semiconductor device according to a third embodiment of the present invention.

The semiconductor device 100a shown in FIG. 9 uses the external potential VDD2 supplied from the outside as the operation potential of each circuit without changing. That is, the semiconductor device 100a is different from the semiconductor device 100 shown in FIG. 4 in that the external potential VDD2 is used as the internal potential VPERI shown in FIG. 4 without being changed. However, predetermined internal potentials, such as VEQ, VARY, and VPP, are supplied to the sense amplifier array 168 and the row decoder 166.

As shown in FIG. 9, the semiconductor device 100a of the present embodiment includes a timing generator 400. The timing generator 400 receives a clock signal CK, which is supplied via a clock terminal 401 and the receiver circuit 130, and generates various timing signals TM based on the clock signal CK. The timing signals TM are supplied to the row address buffer 164, the column address buffer 165, the read amplifier 181, the write driver 182, and other circuits, thereby specifying the operation timings of the circuits. The timing generator 400 uses the internal potential VDLP as the operation potential thereof. In the previous stage of the timing generator 400, a level shifter 402 is connected to convert the amplitude of the clock signal CK from VDD2 to VDLP. In the subsequent stage of the timing generator 400, a level shifter 403 is connected to convert the amplitude of the timing signal TM from VDLP to VDD2.

The reason why the internal potential VDLP is used as the operation potential of the timing generator 400 is that, if the external potential VDD2 is used as the operation potential of the timing generator 400, the active edges of the timing signal TM change in terms of time as the external potential changes. Moreover, there is the possibility that the level of the external potential VDD2 would change due to arbitrary settings or specification changes after product shipment. Therefore, as the operation potential of the timing generator 400, the internal potential VDLP needs to be used because the level of the internal potential VDLP is constant regardless of a potential of the external potential VDD2.

According to the present embodiment, a voltage switching circuit 410 is connected between a node V, from which the operation potential is supplied to the timing generator 400, and the power-supply terminal 102. The voltage switching circuit 410 is a circuit that is so controlled as to be turned ON/OFF depending on the deep power down signal DPPWD. The voltage switching circuit 410 has the same functionality as the above voltage switching circuit 190. Therefore, as the semiconductor device 100a enters the deep power down mode, the external potential VDD2 is supplied as the operation potential to the timing generator 400. As a result, the logic state of the timing signal TM can be properly maintained.

It is apparent that the present invention is not limited to the above embodiments, but may be modified and changed without departing from the scope and spirit of the invention.

For example, according to the above embodiments, as a condition for inactivating the internal voltage generation circuit 110, the semiconductor device 100 or 100a entering the deep power down mode have been described as an example. However, the present invention is not limited to such a condition. That is, in response to another operation mode in which the internal voltage generation circuit 110 is inactivated, the voltage switching circuit 190 or 410 may be controlled.

In addition, while not specifically claimed in the claim section, the applicant reserves the right to include in the claim section of the application at any appropriate time the following device:

A semiconductor device, comprising:
an internal voltage generator configured to produce first and second internal voltages in a first mode corresponding to a non-deep power down state and stop producing the first and second internal voltages in a second mode corresponding to a deep power down state;
a first circuit configured to be supplied with the first internal voltage in the first mode and not to be supplied with the first internal voltage in the second mode; and
a second circuit configured to be supplied with the second internal voltage in the first mode, the second circuit being configured to be supplied with a voltage different from the second internal voltage in the second mode.

What is claimed is:
1. A semiconductor device comprising:
a first circuit configured to generate, when a control signal is at a first level, an internal potential based on a first power-supply potential and to supply the internal potential to an internal node, and stops generating the internal potential when the control signal is at a second level different from the first level;
a second circuit configured to supply a second power-supply potential to the internal node when the control signal is at the second level; and
a third circuit operating on a potential supplied from the internal node to generate an output signal, the third circuit being configured to maintain a logical level of the output signal when the potential supplied from the internal node is changed from the internal potential to the second power-supply potential.
2. The semiconductor device as claimed in claim 1, further comprising:
a first terminal supplied with the first power-supply potential; and
a second terminal supplied with the second power-supply potential,
wherein the first power-supply potential and the second power-supply potential are different in potential level.

3. The semiconductor device as claimed in claim 2, wherein the first power-supply potential is higher than the second power-supply potential.

4. The semiconductor device as claimed in claim 1, wherein the first power-supply potential and the second power-supply potential are the same potential supplied from the same terminal.

5. The semiconductor device as claimed in claim 1, wherein the internal potential is lower than the first power-supply potential.

6. The semiconductor device as claimed in claim 1, further comprising a fourth circuit configured to receive the output signal, the fourth circuit operating on the second power-supply potential.

7. The semiconductor device as claimed in claim 6, further comprising a fifth circuit connected between the third circuit and the fourth circuit, the fifth circuit converting an amplitude of the output signal from an amplitude between a ground potential and the internal potential to an amplitude between the ground potential and the second power-supply potential.

8. The semiconductor device as claimed in claim 1, wherein the third circuit includes a CMOS inverter that outputs the output signal.

9. The semiconductor device as claimed in claim 1, wherein the third circuit is inactivated when the control signal is at the second level.

10. The semiconductor device as claimed in claim 9, wherein the third circuit includes a plurality of volatile memory cells, data held by the volatile memory cells being discarded when the control signal is at the second level.

11. A semiconductor device comprising:
a first power-supply terminal supplied with a first power-supply potential;
a second power-supply terminal supplied with a second power-supply potential different from the first power-supply potential;
a third power-supply terminal supplied with a ground potential;
a first circuit generating, when a control signal is in a first logical level, an internal potential that is different from the first power-supply potential based on one of the first and second power-supply potentials, and supplying the internal potential to an internal node;
a second circuit supplying, when the control signal is in a second logical level different from the first logical level, the second power-supply potential to the internal node; and
a third circuit operating on a first voltage that is applied between the internal node and the third power-supply terminal, and activated when the control signal is in the first logical level, and inactivated when the control signal is in the second logical level.

12. The semiconductor device as claimed in claim 11, wherein both the second power-supply potential and the internal potential are less than the first power-supply potential.

13. The semiconductor device as claimed in claim 11, further comprising a fourth circuit receiving an output signal output from the third circuit,
wherein the fourth circuit operates on a second voltage that is applied between the second power-supply terminal and the third power-supply terminal.

14. The semiconductor device as claimed in claim 13, further comprising a fifth circuit connected between the third circuit and the fourth circuit, the fifth circuit converting an amplitude of the output signal from the first voltage to the second voltage.

15. The semiconductor device as claimed in claim 13, wherein the third circuit keeps the output signal in logical level when the control signal is changed from the first logical level to the second logical level.

16. A semiconductor device comprising:
an internal voltage generator configured to produce an internal voltage in a first mode and stop producing the internal voltage in a second mode;
a level shifter configured to receive the internal voltage, a first voltage and a first signal, in order to convert the first signal from a voltage level of internal voltage to a voltage level of the first voltage and output the first signal with the voltage level of the first voltage; and
a logic circuit configured to produce the first signal, the logic circuit being supplied with the internal voltage in the first mode and supplied with the first voltage in the second mode.

17. The semiconductor device as claimed in claim 16, further comprising:
a receiver circuit configured to receive an input signal from outside to output a second signal, the receiver circuit being supplied with the first voltage either in the first or second mode; and
another level shifter configured to receive the internal voltage, the first voltage and the second signal, in order to convert the second signal from a voltage level of first voltage to a voltage level of the internal voltage and output the second signal with the voltage level of the internal voltage to the logic circuit.

18. The semiconductor device as claimed in claim 17, further comprising an output buffer circuit configured to receive the first signal from the level shifter to output the first signal to outside, the output buffer circuit being supplied with the first voltage either in the first or second mode.

19. The semiconductor device as claimed in claim 16, further comprising a power-supply terminal supplied with the first voltage.

20. The semiconductor device as claimed in claim 16, wherein the internal voltage is lower than the first voltage.

* * * * *

UNITED STATES PATENT AND TRADEMARK OFFICE
CERTIFICATE OF CORRECTION

| | | |
|---|---|---|
| PATENT NO. | : 9,136,844 B2 | Page 1 of 1 |
| APPLICATION NO. | : 13/800540 | |
| DATED | : September 15, 2015 | |
| INVENTOR(S) | : Kiyohiro Furutani | |

It is certified that error appears in the above-identified patent and that said Letters Patent is hereby corrected as shown below:

On The Title Page, Item (30)

The Foreign Application Priority Data on the Letters Patent should be:

Mar. 22, 2012   (JP) .............................. 2012-064748

Signed and Sealed this
Twenty-sixth Day of January, 2016

Michelle K. Lee
*Director of the United States Patent and Trademark Office*